United States Patent [19]
Tsuchiya et al.

[11] 3,963,456
[45] June 15, 1976

[54] AUTOMATIC ASSEMBLY APPARATUS FOR INSERTING ELECTRONIC CONNECTING PINS TO AND/OR FOR MOUNTING ELECTRONIC PARTS ON PRINTED CIRCUIT BOARDS

[75] Inventors: Noriyuki Tsuchiya, Tokyo; Motohiro Murano, Yokosuka; Seiichiro Murata, Tokyo, all of Japan

[73] Assignee: Sony Corporation, Tokyo, Japan

[22] Filed: Oct. 9, 1974

[21] Appl. No.: 513,519

[30] Foreign Application Priority Data
Oct. 15, 1973   Japan................ 48-115467

[52] U.S. Cl............ 29/203 B; 29/203 P; 29/626; 221/264; 221/266
[51] Int. Cl.² ................................ H05K 3/30
[58] Field of Search ........ 29/203 B, 203 P, 203 S, 29/626, 627, 211 R; 228/6, 49; 221/263, 264, 265, 266

[56] References Cited
UNITED STATES PATENTS

| | | | |
|---|---|---|---|
| 2,679,950 | 6/1954 | Swanson | 221/266 |
| 2,853,172 | 9/1958 | Angell | 221/266 |
| 3,327,375 | 6/1967 | Reijnhard et al. | 29/203 B |
| 3,554,403 | 1/1971 | Ginther | 221/264 |
| 3,680,736 | 8/1972 | Viessmann | 221/266 |
| 3,812,569 | 5/1974 | Kufner et al. | 29/203 B |

FOREIGN PATENTS OR APPLICATIONS

| | | | |
|---|---|---|---|
| 2,619 | 1/1971 | Japan | 29/203 |
| 849,441 | 9/1960 | United Kingdom | 221/266 |

*Primary Examiner*—Carl E. Hall
*Attorney, Agent, or Firm*—Hill, Gross, Simpson, Van Santen, Steadman, Chiara & Simpson

[57] ABSTRACT

Apparatus for inserting electronic connecting pins into and/or mounting leadless electronic parts such as capacitors, resistors, inductors and the like on a printed circuit board from a dispensing device, and particularly for securing the fragile electronic parts with uneven lengths onto the printed circuit board.

4 Claims, 26 Drawing Figures

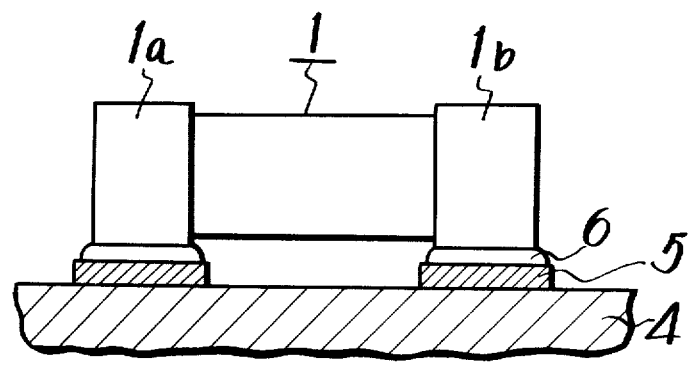
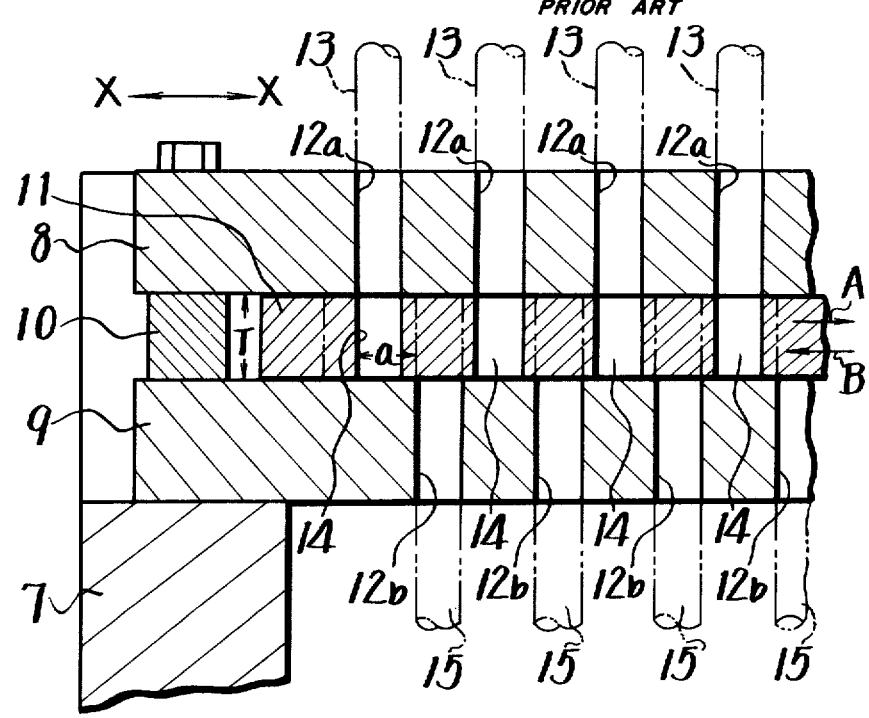

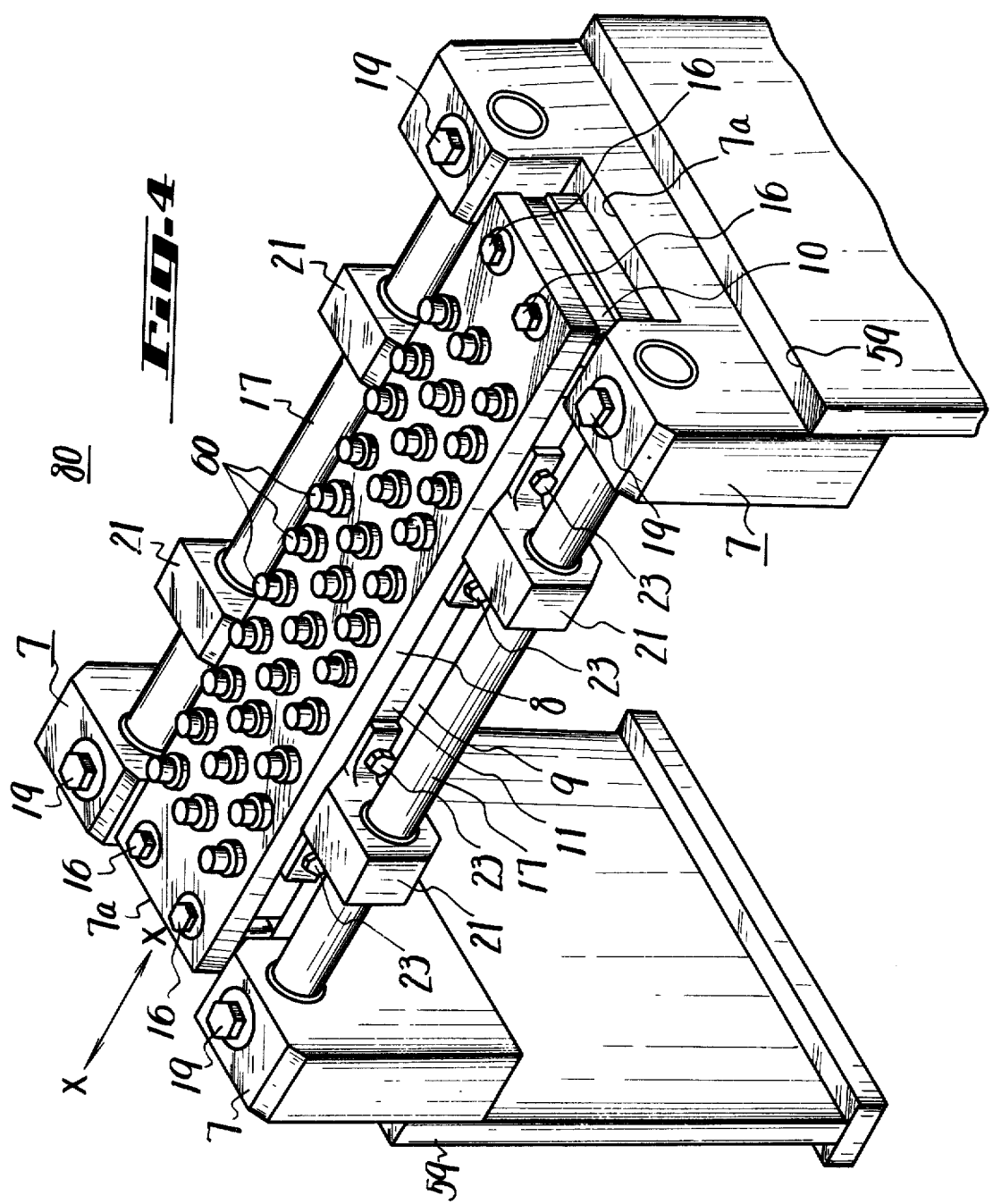

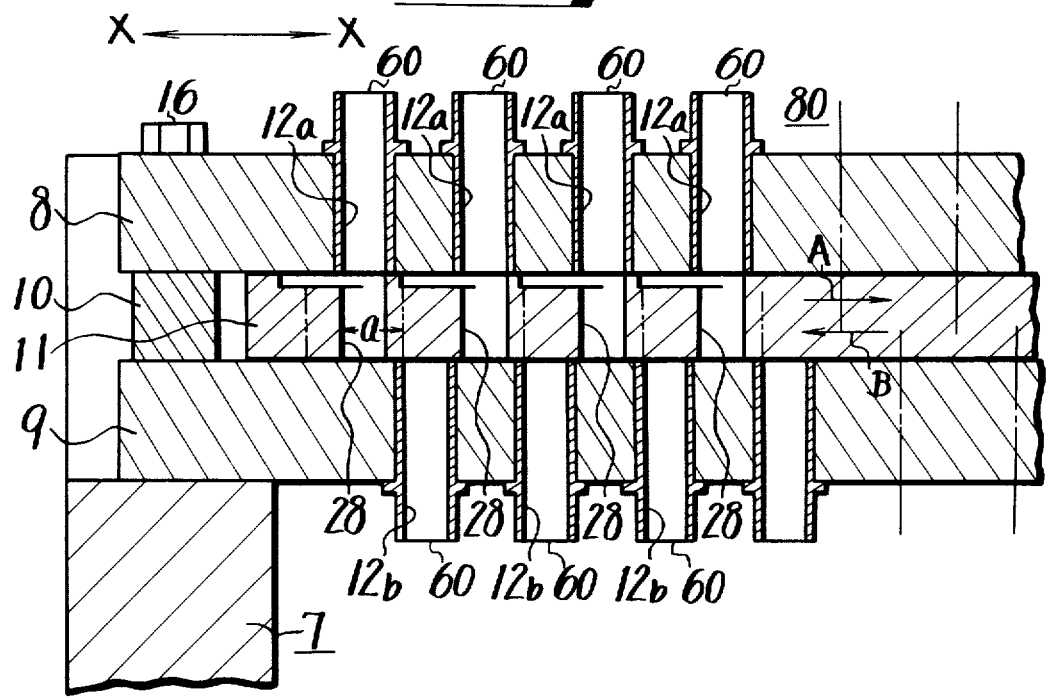
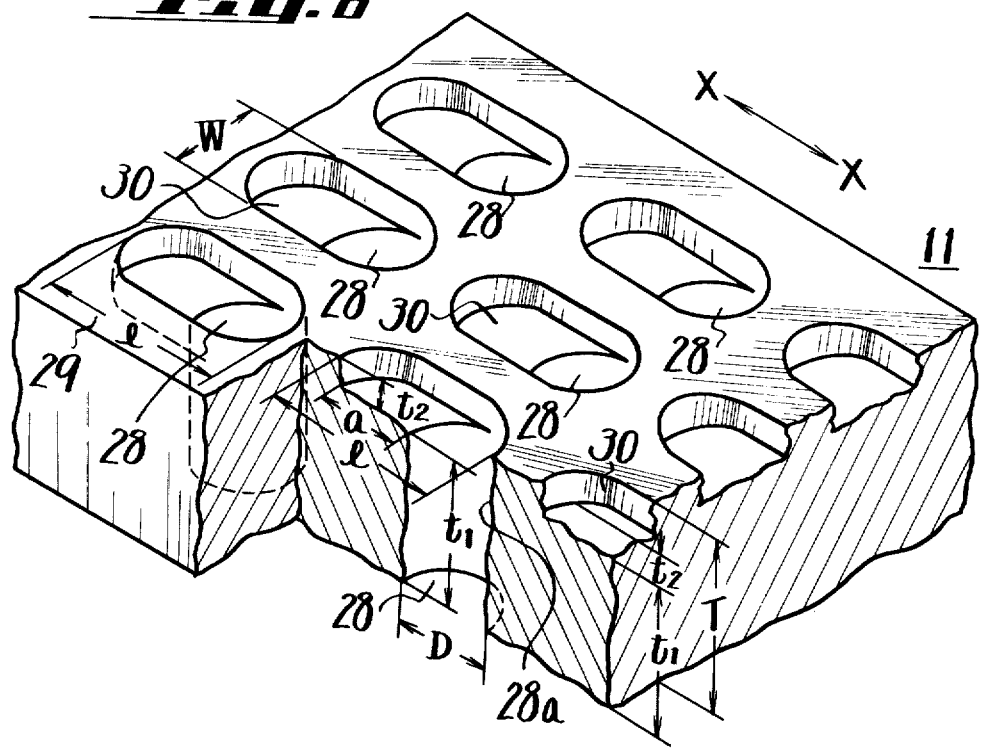

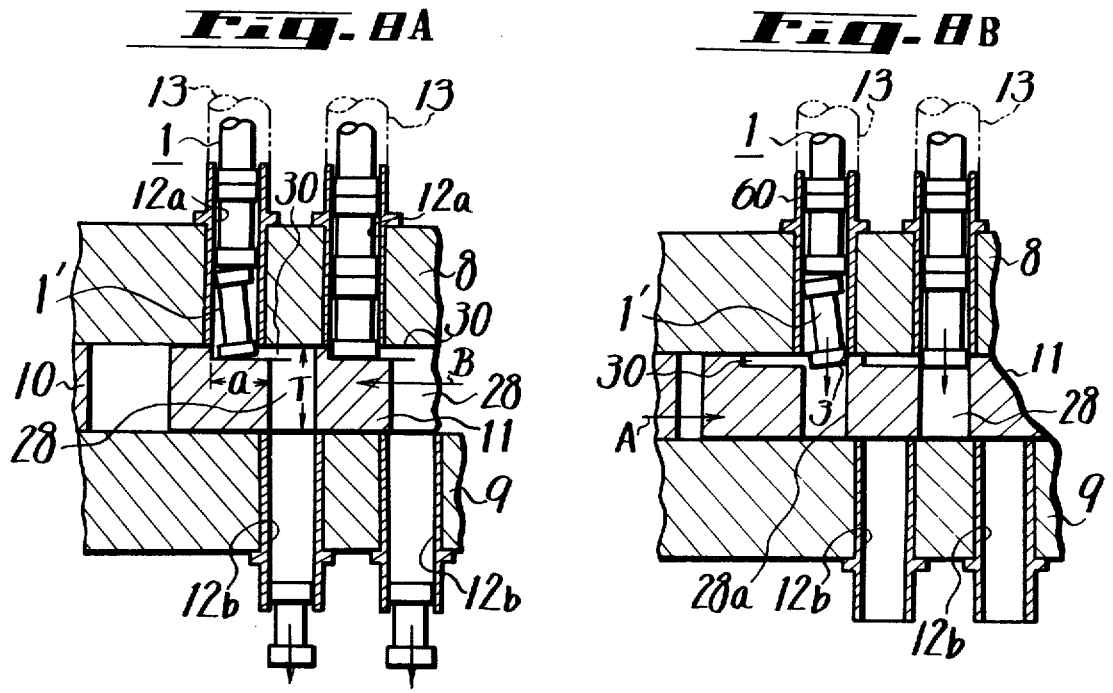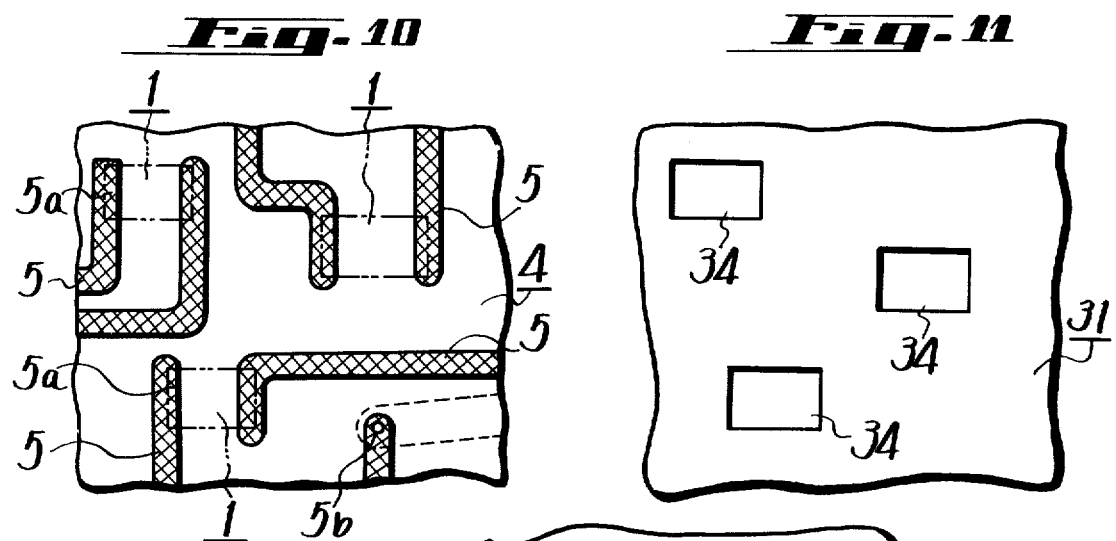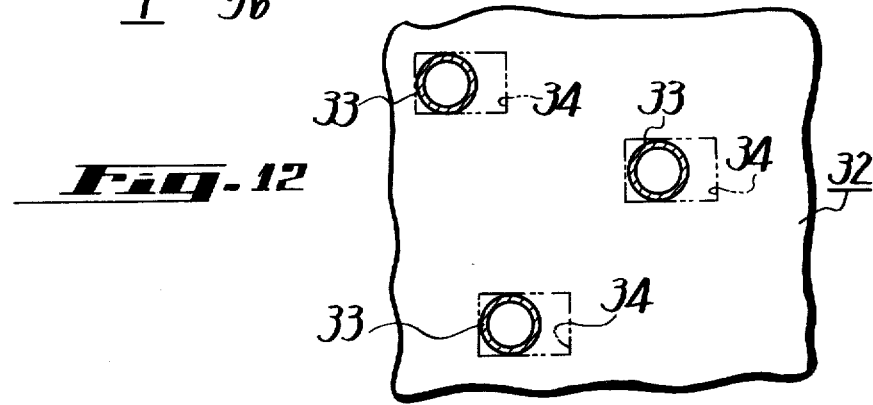

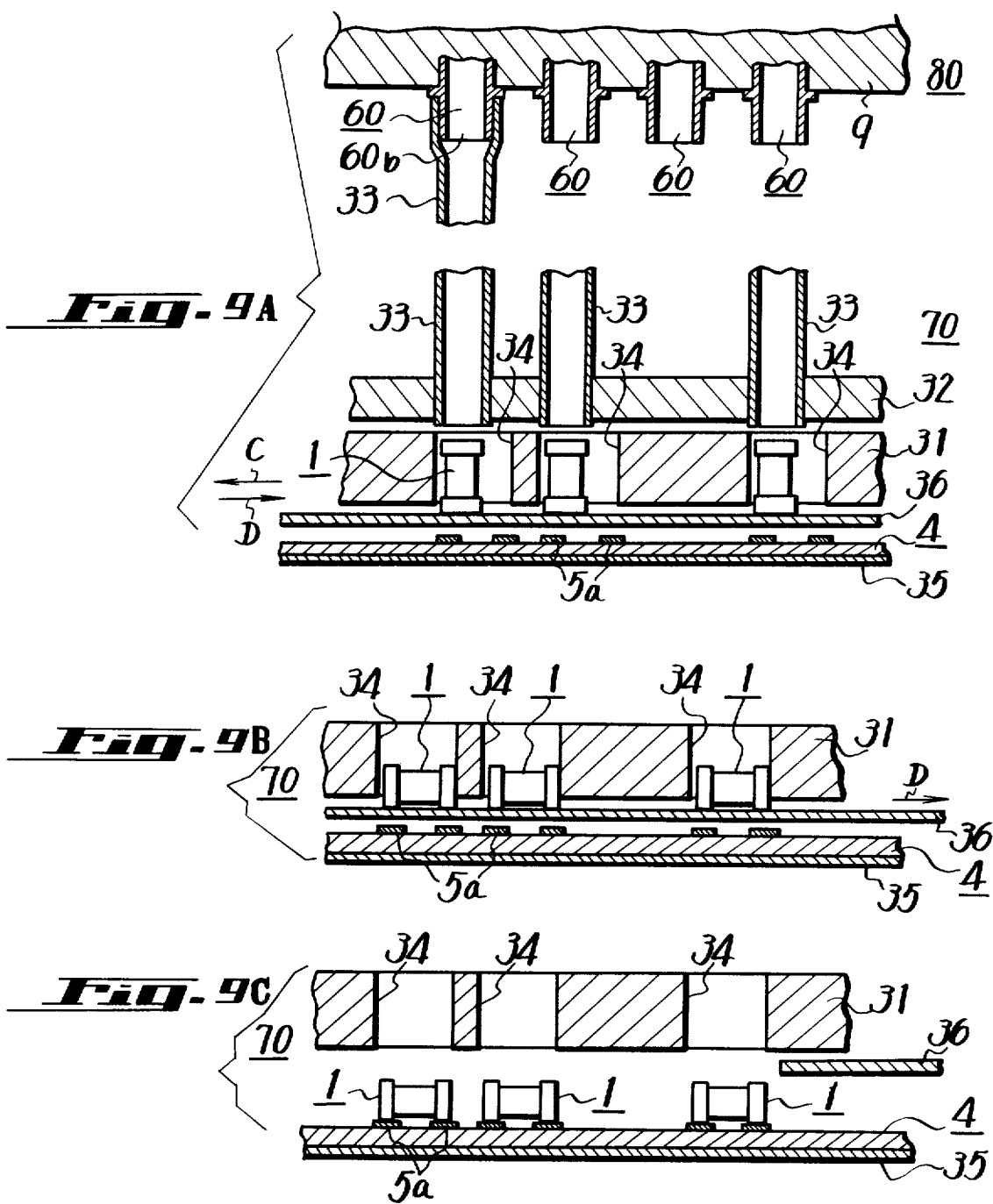

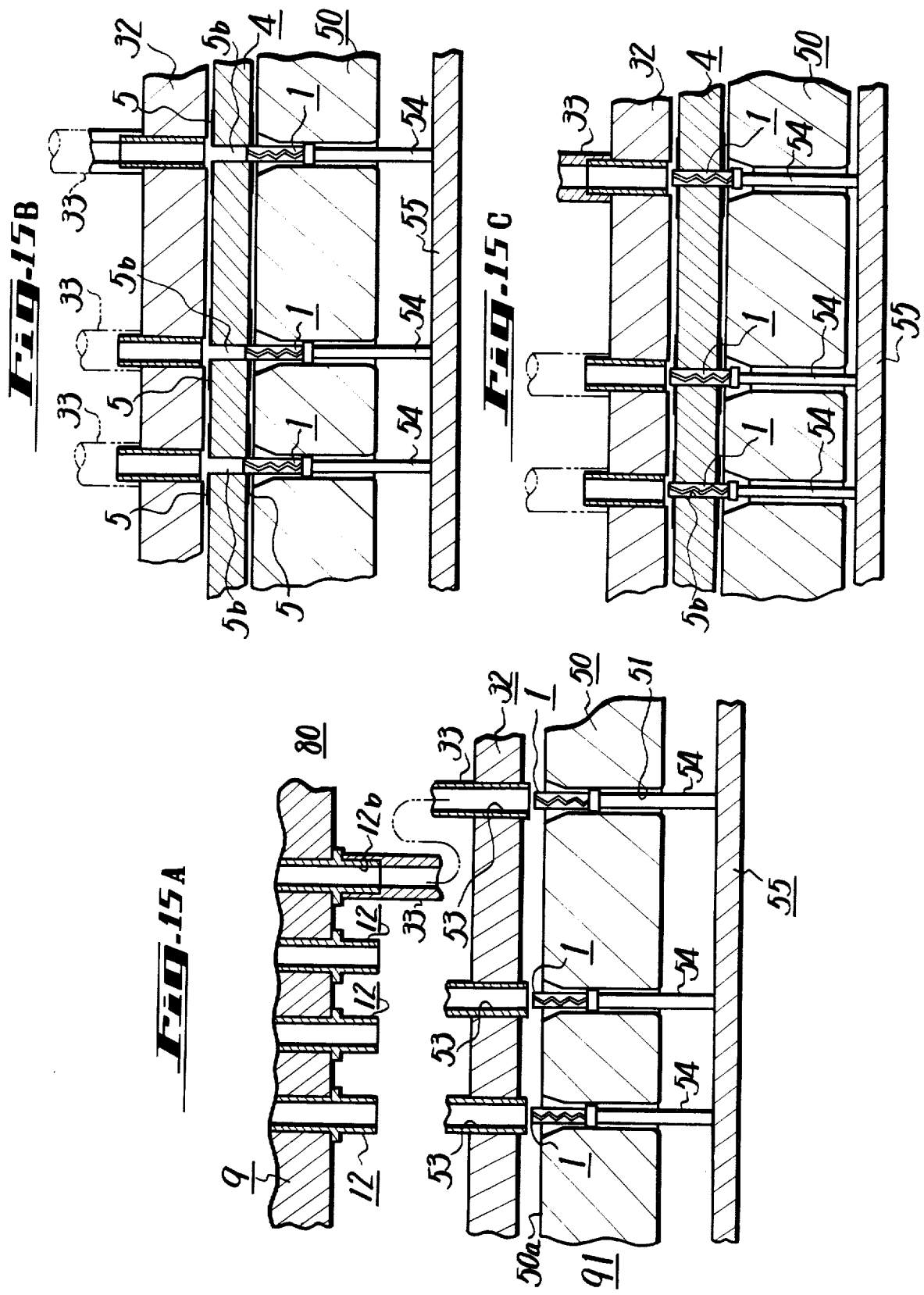

3,963,456

AUTOMATIC ASSEMBLY APPARATUS FOR INSERTING ELECTRONIC CONNECTING PINS TO AND/OR FOR MOUNTING ELECTRONIC PARTS ON PRINTED CIRCUIT BOARDS

BACKGROUND OF THE INVENTION

1. Field of the Invention

The present invention generally relates to an automatic assembly apparatus, and particularly to an automatic assembly apparatus for inserting electronic connecting pins into apertures of a printed circuit board to connect a circuit pattern formed thereon, and/or mounting leadless capacitors, resistors or inductors, particularly fragile ceramic capacitors on the printed circuit board in succession without being broken irrespective of their uneven dimensions.

2. Description of the Prior Art

Assembling discrete electronic parts on a printed circuit board by hand is a tedious, time-consuming and a costly procedure and particularly difficult to obtain desired circuits continuously. This problem has become more acute in recent years by the reason that electronic parts are more miniaturized and used without lead-wires such as in the case of chip capacitors.

Several types of apparatus have been developed to alleviate the assembly problems as described above. One prior art apparatus is an automatic apparatus which dispenses and mounts electronic parts on the printed circuit board. In this case, the electronic parts such as capacitors, resistors, inductors and the like are made of cylindrical or columnar form so as to fit the automatic apparatus. Furthermore, the electronic parts are leadless having a pair of contact portions of terminals formed at the opposite ends thereof.

This automatic apparatus has provided therein dispensing devices the number of which corresponds to the kinds of electronic parts being used on a printed circuit board. One dispensing device delivers one kind of electronic part continuously through one pipe. In the automatic apparatus, the continuously delivered electronic parts are separated one by one and placed sidelong with their electrodes being horizontally placed, thus being disposed on a circuit pattern of the printed circuit board corresponding thereto. However, the dimensions of electronic parts are actually uneven despite standardized production. As a result, due to unevenness in the dimension of the electronic parts, the apparatus comes unworkable or breads the electronic parts.

SUMMARY OF THE INVENTION

It is a main object of this invention to provide a novel automatic assembly apparatus which is free from the above described drawbacks of the prior art apparatus.

It is another object of this invention to provide an automatic assembly apparatus which is capable of mounting all kinds of electroic parts having electrodes at the electronic ends thereof such, for example, as capacitors, resistors, inductors, diodes, transistors and the like completely on a printed circuit board.

It is a further object of this invention to provide an automatic assembly apparatus in which even if electronic parts are uneven in length and particularly of a type having metal caps with uneven lengths, the electronic parts are prevented from being obstructed at the intermediate points of the apparatus, thus allowing the apparatus to make its operation smooth and continuous.

It is a still further object of this invention to provide an automatic assembly apparatus in which even a ceremic capacitor formed in a cylindrical shape with quite low mechanical strength can be handled smoothly, positively and continuously without being broken.

The other objects, features and advantages of this invention will be apparent from the following description taken in conjunction with the accompanying drawings.

BRIEF DESCRIPTION OF THE DRAWINGS

FIG. 1 is an enlarged side view showing an example of electronic parts for use in an apparatus of this invention;

FIG. 2 is an enlarged cross-sectional view showing an example of the main part of a prior art assembly apparatus;

FIG. 4 is a perspective view showing one embodiment of an automatic assembly apparatus according to this invention;

FIG. 5 is an enlarged cross-sectional view showing the main part of the automatic assembly apparatus according to this invention;

FIG. 6 is an enlarged perspective view showing one example of a movable member used in the apparatus of this invention;

FIGS. 7A, 7B, 8A and 8B are enlarged cross-sectional views of the main parts respectively used for explaining the operation of the automatic assembly apparatus according to this invention;

FIGS. 9A, 9B and 9C are cross-sectional views respectively showing one example of a part dispensing device;

FIGS. 10, 11 and 12 are schematic plan views respectively showing the principal portion of the apparatus of this invention;

FIGS. 15A, 15B and 15C are enlarged cross-sectional views respectively showing the dispensing devices in different conditions.

DESCRIPTIONS OF THE PREFERRED EMBODIMENTS

Figure 3:
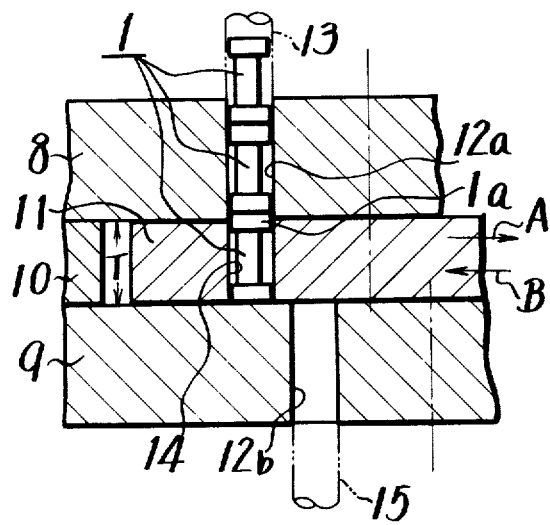
FIGS. 3A and 3B are enlarged cross-sectional views of the main part respectively used for explaining the prior art assembly apparatus.
Figure 3:
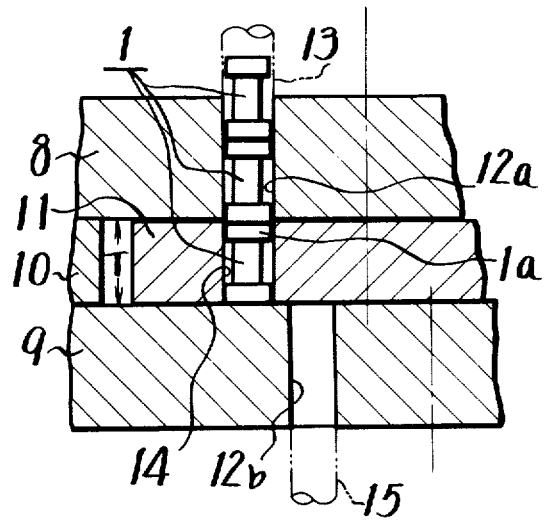

FIG. 1 shows an electronic part which is considered as being generally used for an apparatus of this invention and disposed on a circuit pattern of a printed circuit board. In FIG. 1, a cylindrical or columnar electronic part 1 such as a capacitor, resistor or the like having caps 1a and 1b provided at its opposite ends is directly soldered on a printed circuit board 4 at its predetermined wiring circuit 5 without lead wires by using solder 6. In this case, by a dispensing device the respective parts 1 are automatically delivered to be placed on the circuit board 4 at its predetermined wiring positions where solder is simultaneously mounted on and soldered by being moved through a heating furnace.

FIG. 2 shows a prior art automatic assembly apparatus and FIGS. 3A and 3B are enlarged cross-sectional views respectively showing the main portion of the prior art apparatus. Reference numeral 7 designates a holding base for holding an upper fixed member 8 and a lower fixed member 9 which are respectively of a plate-shape and horizontally disposed with a required distance being held therebetween through a spacer 10. A plate-like movable member 11 is interposed between both the fixed members 8 and 9 so as to be slidably reciprocated therethrough in directions indicated by arrows A and B.

The upper fixed member 8 has bored therethrough a plurality of apertures 12a to pass the electronic parts 1 and the lower fixed member 9 has bored therethrough a plurality of apertures 12b to pass the electronic parts 1 in the same manner as the upper fixed member 8. Each aperture 12b of the lower fixed member 9 is arranged corresponding to the aperture 12a of the upper fixed member 8 but disposed at a position shifted therefrom by an interval a in an X—X direction in FIG. 2.

In addition, the movable member 11 has also bored therethrough apertures 14 to pass the parts 1 corresponding to the apertures 12a or 12b of the upper or lower fixed member.

Each aperture 12a of the upper fixed member 8 is fed with the electronic parts 1 continuously through each pipe 13 from above. Assuming that each aperture 14 of the movable member 11 is located at a position coincident with each aperture 12a as shown in FIG. 2, the part 1 fed to each aperture 12a falls into each aperture 14. When the movable member 11 is slidely moved in the direction of arrow A by the interval a under the above condition, the part 1 falls into the aperture 12b of the lower fixed member 9 and successively delivered on the circuit board 4 at its predetermined portion through the pipe 15 coupled to the lower portion of the aperture 12b.

The parts 1 are thus delivered into the pipes 15 and thereafter the movable member 11 is slidely moved by the interval a in the direction of arrow B and returned to the original position. When the aperture 14 of the movable member 11 coincides with the aperture 12a of the upper fixed member 8, the folowing part 1 automatically falls into the aperture 14. Thus, the movable member 11 is slidably reciprocated to the direction of arrow A or B continuously thereby to deliver the part 1 from each aperture 12b one by one in order.

However, the dimensions such as length, thickness and the like of the electronic parts 1 are actually uneven irrespective of the standardized production of the electronic parts 1, and such an irregularity of the dimensions thereof will inhibit the above described prior art apparatus in making its continuous smooth operation. In the case when the length or height of the part 1 fallen into the aperture 14 of the movable member 11 is larger than the depth of the aperture 14 or the thickness T of the plate-like movable member 11 as depicted in FIG. 3A, the terminal cap 1a of the part 1 butts against the lower end portion of the aperture 12a of the upper fixed member 8 to restrain the movable member 11 from being moved to the direction of arrow A. In this case, if the member 11 is forcibly moved, the part 1 is broken and its broken pieces obstruct the movable member 11 from being slidably moved or disturb the delivery of the part 1 with the result that the part 1 is prevented not only from being fed smoothly but also the part quality is deteriorated.

Further as shown in FIG. 3B, when the height of the electronic part 1 which falls into the aperture 14 of the movable member 11 is smaller than the thickness T thereof, the lower end portion of the following part 1 is inserted into the aperture 14 to obstruct the operation of the automatic assembly apparatus or to deteriorate the quality of the part 1 similarly as described above.

In view of such an aspect, the present invention is designed to avoid causing the damage of the part or obstructing the smooth operation of the automatic assembly apparatus even though the parts to be delivered are uneven in length or height.

FIGS. 4, 5 and 6 show an automatic assembly apparatus of this invention, in which reference numeral 80 represents the whole apparatus. In FIGS. 4, 5 and 6, elements corresponding to those of FIGS. 1 to 3 are marked with the same reference numerals with their repeated description being omitted.

In the embodiment according to this invention, two fixed members 8 and 9 are provided similarly as the above example. For example, a pair of opposing leg portions 59 of the holding base 7 have provided therein opposing concave portions 7a at each upper end surface thereof. First and second fixed members, that is, the upper and lower fixed members 8 and 9 are disposed across both the concave portions 7a with the spacers 10 being interposed therebetween. In the concave portions 7a of the leg portions 59 the fixed members 8 and 9 are fixed at their both ends, for example, by bolts 16. The movable member 11 is slidably disposed between the fixed members 8 and 9. In addition, across both the leg portions 59 of the holding base 7 there are provided guiding rods 17 at both sides of the fixed members 8 and 9 for slidably guiding the movable member 11. Reference numeral 19 denotes one of the fixing bolts which fix the guiding rods 17 to the leg portions 59.

The guiding rods 17 are positioned at both the sides of the movable member 11. Slidable guides 21, which to slide along the guiding rods 17, are fixed to the movable member 11 by screws 23 to make the same slidable in the axial direction of the guiding rods 17.

The fixed members 8 and 9 are respectively penetrated with sleeves 60 through the apertures 12a and 12b. The aperture 12a or 12b, or each sleeve 60 is formed, for example, circular in cross-section corresponding to the cross-sectional configuration of the part 1 with its inner diameter being selected to be a little larger than the outer diameter of the part 1 so that the part 1 may be guided along the axial direction of each aperture without being upside-down or laid-down therein. The disposing relation between the aperture 12a of the fixed member 8 and the aperture 12b of the fixed member 9 is selected so as to be shifted by the interval a with respect to the slidable direction of the movable member 11 or the axial direction of the guiding rod 17, that is the X—X direction as shown in FIG. 5.

The movable member 11 has bored therethrough apertures 28. The number of the apertures 28 and the disposing relation thereof are selected to be corresponding to those of the apertures 12a and 12b of the fixed members 8 and 9. Similarly as the above-mentioned apertures 12a and 12b, the inner cross-sectional shape of the aperture 28 is formed, for example, circular corresponding to the outer cross-sectional shape of the part 1 with its inner diameter being selected to be a little larger than the outer diameter thereof so that the part 1 may be inserted along the aperture 28 without being upside-down or laid-down therein. Particularly, in this invention, at a surface 29 of the movable member 11 in opposition to the upper fixed member 8, there are provided recesses 30 which are each formed by cutting-away the end edge of each aperture 28. The recess 30 is formed in an elliptic shape which extends from each aperture 28 in one direction along the moving direction X—X of the movable member 11.

The depth of the aperture 28 of the movable member 11, that is, the thickness of the plate-like movable member 11 is selected larger than the maximum length of the largest parts 1 having uneven lengths thereof. While, the reduced depth $t_1$ of the aperture 28 owing to the cut away by the recess 30, that is, the depth $T - t_2$, where $t_2$ denotes the thickness of the recess 30, is selected smaller than the minimum length of the smallest parts 1 having uneven lengths thereof.

The lateral width W of the recess 30 is selected to be equal to or larger than the inner diameter D of the aperture 28, while the longitudinal length $l$ of the recess 30 is selected to be equal to or larger than the sum of the inner diameter D of the aperture 28 and the shift $a$ between the respective apertures of the upper and lower fixed members 8 and 9.

Figure 7:
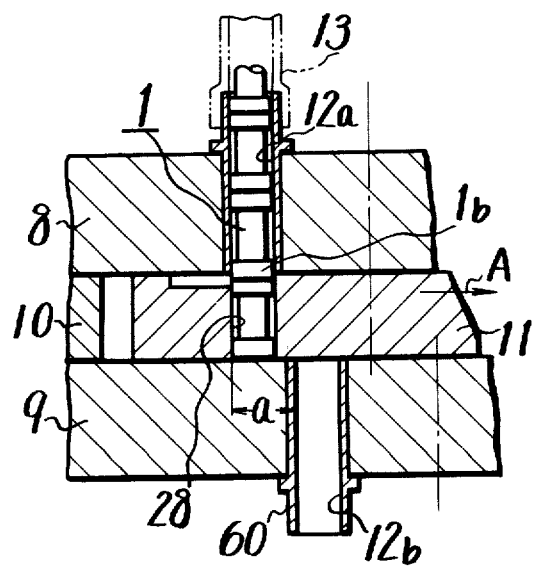
Figure 7:
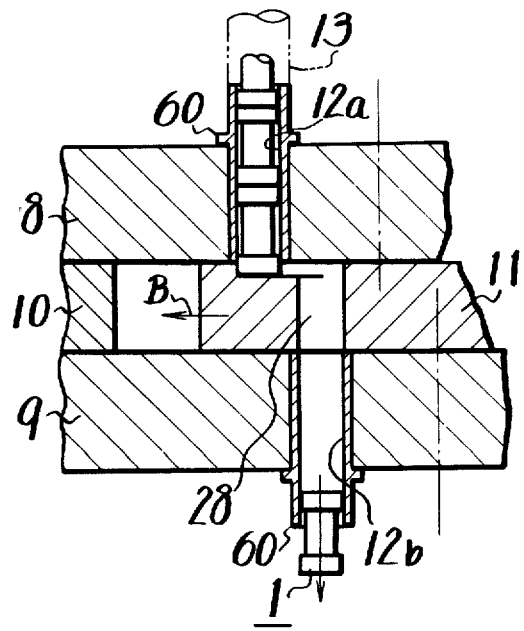

An operation of this apparatus will next be described with reference to FIGS. 7A and 7B. At first, as depicted in FIG. 7A the movable member 11 is brought to a position where the aperture 28 thereof is coincident with the aperture 12a of the upper fixed member 8. Thus, the parts 1 are continuously delivered into the aperture 12a of the fixed member 8 through the pipe 13, so that each part 1 in each aperture 12a falls into the aperture 28 of the movable member 11. Next, the movable member 11 is moved to a direction of arrow A by the distance $a$ to cause the aperture 28 to coincide with the aperture (2b of the lower fixed member 9 as shown in FIG. 7B. With the above arrangement, each one part 1 in the aperture 28 falls into the aperture 12b and delivered therethrough to a predetermined position of the printed circuit board, though not shown. Then, the movable member 11 is again moved to a direction of arrow B by the distance $a$ to cause the aperture 28 to coincide with the aperture 12a as shown in FIG. 7A. Thus, similarly as described above, the next part 1 in the aperture 12a falls into the aperture 28, and the reciprocation of the movable member 11 to the direction of arrows A and B will cause the parts 1 to be supplied through the respective apertures 12b.

In this case, even with irregularity in size of the parts 1, since the thickness T of the movable member 11 is selected larger than the maximum length of the parts 1, all of the parts 1 which fall into the apertures 28 will not project into the apertures 12a of the upper fixed member 8 resulting in no obstruction for the movement of the movable member 11.

Further, since the movable member 11 is provided with the recesses 30 and the thickness of each recess 30 is suitably selected so that the reduced depth $t_1$ of the aperture 28 is smaller than the minimum length of the parts 1, when a small-sized part 1 falls into the aperture 28 and the terminal cap 1b of the next part 1 is projected down from the lower end of the aperture 12a as shown in FIG. 7A, the movable member 11 will not be obstructed from being moved to the directions of arrows A and B due to the presence of the recess 30.

Thus, according to the present invention, even with irregularity in length of height of parts, the movable member 11 can be smoothly moved to prevent the parts 1 from being broken to produce inferior parts and also preventing the apparatus from being improperly operated owing to broken pieces of the part 1.

Besides, with the apparatus of this invention, even when an electronic part 1' with its outer diameter being smaller than the usual one is delivered from the above as shown in FIG. 8A, the apparatus can be smoothly operated. In other words, when the electronic part 1' with small outer diameter is located inside the aperture 12a, the part 1' comes to be sometimes slanted as the movable member 11 is moved. In this case, when the movable member 11 is moved to the direction of arrow B, the end portion 3 of the electronic part 1' with small outer diameter is pushed back by engagement with an inner wall surface 28a of the aperture 28 in opposition to the recess 30 as shown in FIG. 8B, and hence the slanting part 1' falls into the aperture 28 without being caught on the upper surface of the movable member 11. Accordingly, even when the electronic part 1' with small outer diameter is present, the apparatus can be smoothly operated.

A description will next be given on a dispensing device for dispensing the parts 1 taken out from the apertures 12b of the lower fixed member 9 with reference to FIGS. 9A, 9B and 9C. In the figures, reference numeral 70 indicates a dispensing device as a whole. As shown in FIG. 9A, a flexible pipe 33 is coupled with each sleeve 60 of the lower fixed member 9 of the automatic assembly apparatus 80 or a selected sleeve 60 thereof to be required at its lower end 60b.

Meanwhile, the printed circuit board 4 to be mounted with parts 1 is placed on a mounting base 35 and a mask plate 31 is disposed in an opposed relation with the circuit board 4. The mask plate 31 has bored therethrough apertures 34 at positions corresponding to portions on the circuit board 4 where the parts 1 are mounted. In the case when the parts 1 are intended to be disposed on the printed circuit board 4, for example, positions 5a indicated by chain lines across the end portions of wiring 5 as shown in FIG. 10, the mask plate 31 has bored therethrough the apertures 34 of, for example, rectangular shape corresponding to the projected configurations of the parts 1 on the circuit board 4 in opposition to positions at which the parts 1 are disposed as shown in FIG. 11.

In FIG. 9A, reference numeral 32 designates a pipe fixing plate for setting the free ends of the flexible pipes 33 to positions opposite to the respective apertures 34 of the mask plate 31. Each pipe 33 is located to one side of its corresponding aperture 34 of the mask plate 31 as shown in FIG. 12.

In addition, a slidable plate 36 is interposed between the mask plate 31 and the printed circuit board 4.

With the above described construction, the parts 1 delivered one by one from the apertures 12b of the lower fixed member 9 of the automatic assembly apparatus 80 fall through the flexible pipes 33 into each aperture 34 of the mask plate 31 at its one side and placed on the slidable plate 36. In this case, an electronic part 1 is kept in an erect state at the position biased to one side of each aperture 34 as shown in FIG. 9A. Next, the slidable plate 36 having the electronic parts 1 erected thereon is moved to a direction opposite to the biased side of the parts 1, that is, to a direction of arrow D in the figure. Then, the parts 1 are moved in the apertures 34 such that the parts are being placed on the slidable plate 36 and tumbled by the engagement against the other side of the aperture 34 with the result that each part 1 falls sidelong in the aperture 34 of the mask plate 31 as shown in FIG. 9B. The position of the horizontal electronic part 1 coincides with the part mounting position 5a of the wiring circuit 5 on the printed circuit board 4 disposed under the mask plate 31. Therefore, if the slidable plate 36 is drawn out from between the aperture 34 of the mask plate 31 and the circuit board 4, the part 1 is placed on the predetermined position 5a of the wiring circuit 5 on the printed circuit board 4 as shown in FIG. 9C. The circuit board 4 with the part 1 is transferred from the mounting base 35 or together with the mounting base 35 and passed through, for example, a heating furnace thereby to solder the part 1 to, for example, the wiring 5.

Thereafter, if another circuit board 4 is again brought under the mask plate 31 with the above described operation being repeated, the electronic parts 1 can be automatically placed on a great number of circuit boards 4 respectively with a predetermined pattern.

The apparatus 80 of this invention described with reference to FIGS. 4 to 8, inclusive, is of a case wherein the movable member 11 is horizontally and slidably reciprocated between two plate-like fixed members 8 and 9 to effect the intermittent feeding of the parts 1. In this connection, it is also possible to perform the intermittent feeding of the parts 1 by the reciprocal rotation of the movable member with respect to the fixed member. One embodiment of this case will be described with reference to FIG. 13.

In this case, there is provided a cylindrical fixed member 42 in which a reciprocally rotatable member 43 of cylindrical shape is further provided. The fixed member 42 is disposed with its axial direction being substantially horizontal. The upper wall of the fixed member 42 is penetrated therethrough with a sleeve 60 to form the aperture 12a through which the part 1 can be passed in the same manner as the above-mentioned example. The sleeve 60 is coupled at its outer end with the part feeding pipe 3 through which the parts 1 are continuously fed into the aperture 12a. Further, the sleeve 60 is penetrated through the lower wall of the fixed member 42 to form the part taking-out aperture 12b through which the parts 1 can be passed. The apertures 12a and 12b are disposed on the same circumference of the fixed member 42.

The rotatable member 43 has provided therein a part receiving concave portion 45 facing to its peripheral surface which can selectively oppose to the apertures 12a and 12b at the respective rotary positions. The depth T of the concave portion 45 is selected larger than the maximum length of the parts 1 among the uneven lengths or heights thereof. Meantime, a recess 47 is provided on the rotatable member 43 at one side with respect to the concave portion 45 thereby to partially reduce the depth of the concave portion 45 from its bottom. The reduced depth $t_1$ of this portion is selected smaller than the minimum length of the parts 1 among the uneven lengths or heights thereof. The recess 47 is provided so that the concave portion 45 may locate at the back side to rotate from a position opposite to the aperture 12a to a position opposite to the aperture 12b. The concave portion 45 can be provided at its bottom portion with a ventilating aperture 46, if necessary.

Figure 13A:
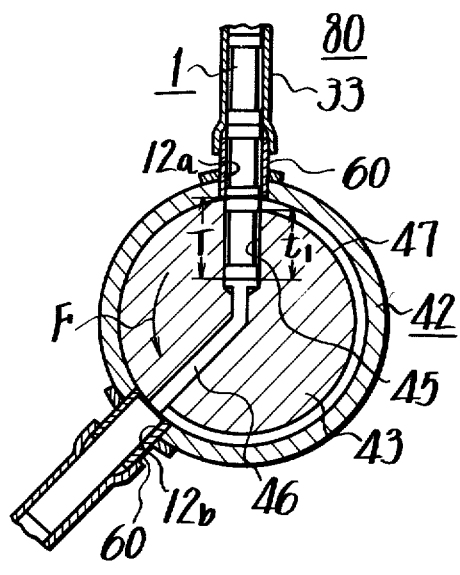
FIGS. 13A and 13B are enlarged cross-sectional views of the respective operating states of the main part showing another example of the apparatus of this invention.
Figure 13B:
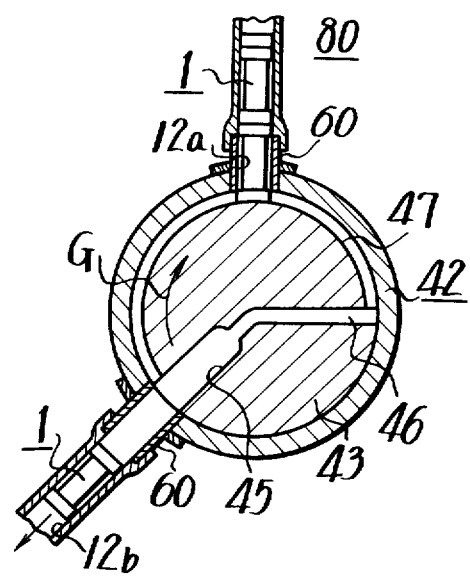

With such a construction, the automatic assembly apparatus 80 performs the feeding operation of the electronic parts 1 in the following manner. That is, with the aperture 21a being continuously fed with the part 1, the rotatable member 43 is brought to a position where the concave portion 45 is opposed to the aperture 12a as shown in FIG. 13A. With such an arrangement, the part 1 filled in the aperture 12a falls into the concave portion 45. Then, the rotatable member 43 is rotated as indicated by an arrow F to make the concave portion 45 opposite to the aperture 12b as shown in FIG. 13B. Thus, the part 1 in the concave portion 45 is taken out through the aperture 12b. After the part 1 has been taken out, if the rotatable member 43 is rotated as indicated by an arrow G to be restored as shown in FIG. 13A, the next part 1 similarly falls into the concave portion 45 and the same operation as mentioned above is repeated to take out the parts 1 from the aperture 12b intermittently one by one. The electronic parts 1 taken out are delivered to predetermined positions on the circuit board 4 similarly as mentioned above by the dispensing device 70 described in FIGS. 9 to 12, inclusive.

In an actual case, the fixed member 42 and rotatable member 43 are provided with a plurality of sets of apertures 12a, 12b and concave portions 45 along the axial direction thereof to effect the simultaneous taking-out operation of the plural parts 1 from the respective apertures 12b.

Also, with the apparatus 80 of this invention constructed as described above, since the depth T of the concave portion 45 in the rotatable member 43 is selected larger than the maximum length of the parts 1 similarly as the aforesaid embodiment, any part 1 will not damage the aperture 12a by projecting thereinto above the concave portion 45. Besides, even if a small-sized part 1 is inserted into the concave portion 45 and the lower end of the next part 1 is projected from the aperture 12a into the concave portion 45, since the rotatable member 43 is provided with the recess 47 at the back side of the concave portion 45 with respect to the rotating direction of arrow F, the lower end of the next part 1 will not disturb the rotation of the rotatable member 43 to the direction of arrow F and no damage will be caused. As a result, even in this case, the initial object can be positively achieved.

Figure 14A:
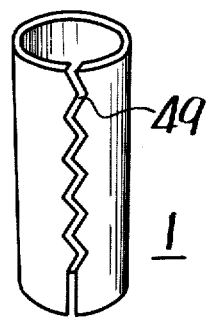
FIGS. 14A, 14B, 14C and 14D are enlarged perspective views respectively showing each example of a part used for explaining this invention.
Figure 14B:
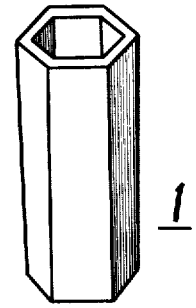
Figure 14C:
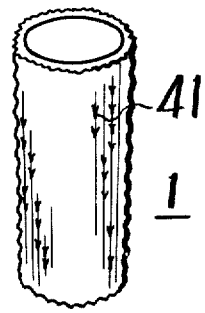
Figure 14D:
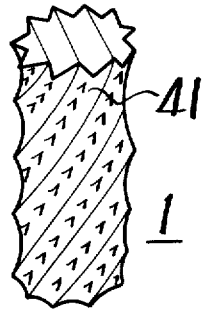

The above described embodiments are of the case where the parts 1 are placed on the printed circuit board 4 for being mounted thereto. In this connection, when the part 1 is, for example, a through-hole pin served to electrically interconnect the front and rear wirings of the printed circuit board, the automatic assembly apparatus of this invention is also applicable thereto for effecting the feeding operation thereof. In this case, the through-hole pin serving as the part 1 can be used of a construction such as to form, for example, a wave-like recess 49 in a metal cylindrical member along its axial direction as shown in FIG. 14A. In another case, there can be used a hollow prism member as depicted in FIG. 14B. As a further example, there can be used a metal cylinder with ragged stripes 41 formed on its outer peripheral surface along its axial direction or slantly as shown in FIGS. 14C and 14D. In addition, the stripes 41 can be further formed with a wave-shaped uneven pattern. A dispensing device 91 for urging the through-hole pin 1 to penetrate through the printed circuit board 4 will be hereinbelow described with reference to FIGS. 15A, 15B and 15C.

Also, in this case, as shown in FIG. 15A, the flexible pipe 33 is coupled to the aperture 12b of the present automatic assembly apparatus 80 and the opposite end of the pipe 33 is fixed by the pipe fixing plate 32 at a position corresponding to the disposing position of the through-hole pin with respect to the printed circuit board 4 in the same manner as the example described with reference to FIG. 9.

Meanwhile, since a required distance is determined with the pipe fixing plate 32, there is provided a receiving plate 50 having bored therethrough apertures 51 each of which is opposed to the end portion of each pipe 33 and once received therefrom with the through-hole pin 1. Under the receiving plate 50 there is provided a push-up mechanism 55 having rods 54 which are to be inserted into the respective apertures 51.

At first, as shown in FIG. 15A the part or through-hole pin 1 is inserted from the pipe 33 into the aperture 51 of the receiving plate 50. At this time, the bottom portion of the aperture 51 is closed by the rod 54 and hence the pin 1 is received by the rod 54. Thereafter, as shown in FIG. 15B the printed circuit board 4 is interposed between the pipe fixing plate 32 and the receiving plate 50, the circuit board 4 having bored therethrough apertures 5b for inserting the pins 1 at predetermined positions. In this case, the aperture 5b of the circuit board 4 and the aperture 51 of the receiving plate 50 are arranged to be coincident with each other. Then, as shown in FIG. 15C the rod 54 is pushed-up into the aperture 51 by the push-up mechanism 55 to press the part or pin 1 into the aperture 5b of the circuit board 4.

Thus, the through-hole pin 1 is inserted through the circuit board 4 at its predetermined position, so that thereafter the pin 1 is soldered, if required, to the end portion of the wiring 5 which is provided on the front or rear surface of the circuit board 4 and extended to the aperture 5b.

With the above arrangement, a plurality of through-hole pins can be simultaneously mounted through the circuit board 4 and the automatic mounting operation thereof can also be carried out.

While the principles of the invention have been described above in connection with specific embodiments, it is to be clearly understood that this description is made only by way of example and not as a limitation on the scope of the invention.

We claim:

1. An automatic assembly apparatus adapted for mounting leadless electronic parts on a printed circuit board, comprising:
   a. first and second spaced apart fixed members, said first member having an aperture for receiving electronic parts, said second member having an aperture displaced from a central axis of said first fixed member aperture;
   b. a reciprocating movable member slidably disposed between said first and second spaced apart fixed members, said movable member having an aperture for receiving the parts from said first member aperture when aligned with said movable member aperture, said movable member aperture having a recess extending therefrom and adjacent said first fixed member, said recess having a length at least equal to a displacement between the first and second fixed member apertures along which said movable member communicates, said movable member aperture having a depth larger than the maximum length of said parts while the reduced depth of said aperture at said recess is smaller than the minimum length of said parts;
   c. one end of a flexible part feeding pipe being connected to said second fixed member aperture on the opposite side from said movable member;
   d. a pipe fixing plate having a part receiving aperture, one end of said aperture connecting with the other end of said flexible feeding pipe; and
   e. mounting means disposed below said pipe fixing plate for mounting said parts on a circuit board aligned with said mounting means, said mounting means comprising a mask plate having a rectangular aperture aligned with said pipe fixing plate aperture and having a length and height at least equal to the length and height of the parts, and a slidable plate disposed under said mask plate for receiving and dispensing said part on the printed circuit board by moving between said mask plate and printed circuit board.

2. An automatic assembly apparatus adapted for mounting leadless electronic parts on a printed circuit board, comprising:
   a. a cylindrical fixed member having a part receiving aperture and a part feeding aperture;
   b. a reciprocally rotating movable member provided within said cylindrical fixed member, said movable member having a receiving concave portion facing its peripheral surface and which has a depth larger than a maximum length of said parts, said rotating member also having a recess joined with said concave portion and provided on said peripheral surface of said movable member, said concave portion at said recess having a depth smaller than a minimum length of said parts;
   c. one end of a flexible part feeding pipe being connected to said part feeding aperture on the opposite side from said movable member;
   d. a pipe fixing plate having a part receiving aperture, one end of said aperture connecting with the other end of said flexible feeding pipe; and
   e. mounting means disposed below said pipe fixing plate for mounting said parts on a circuit board aligned with said mounting means, said mounting means comprising a mask plate having a rectangular aperture aligned with said pipe fixing plate aperture and having a length and height at least equal to the length and height of the parts, and a slidable plate disposed under said mask plate for receiving and dispensing said part on the printed circuit board by moving between said mask plate and printed circuit board.

3. An automatic assembly apparatus for inserting pins on a printed circuit board, comprising a fixed member and a movable member, said fixed member being provided therethrough with an aperture for inserting pins and said movable member being also provided therethrough with a pin receiving aperture shifted from a central axis of said fixed member aperture, said movable member aperture having a recess extending therefrom and adjacent said fixed member, said recess having a length at least equal to a shift distance between the fixed and movable members, said movable member aperture having a depth larger than the maximum length of said pins while the reduced depth of said aperture at said recess is smaller than the minimum length of said pins, a lower fixed member disposed under said movable member and having an aperture bored therethrough for receiving discrete pins from said movable member aperture, the aperture of said lower fixed member being provided with a sleeve which is further coupled with a flexible pin feeding pipe, a pipe fixing plate having a pin receiving aperture disposed in opposition to the free end of said pipe, a receiving plate having a pin receiving aperture, and a mechanism having a rod inserted into said pin receiving aperture for pushing up a connecting pin in said receiving plate aperture.

4. An automatic assembly apparatus adapted for mounting pins on a printed circuit board, comprising:
 a. a cylindrical fixed member having a pin receiving aperture and a pin feeding aperture;
 b. a reciprocally rotating movable member provided within said cylindrical fixed member, said movable member having a receiving concave portion facing its peripheral surface and which has a depth larger than a maximum length of the pins, said rotating member also having a recess joined with said concave portion and provided on said peripheral surface of said movable member, said concave portion at said recess having a depth smaller than a minimum length of said pins;
 c. one end of a flexible pin feeding pipe being connected to said pin feeding aperture on the opposite side from said movable member;
 d. a pipe fixing plate having a pin receiving aperture, one end of said aperture connecting with the other end of said flexible feeding pipe; and
 e. a receiving plate having a pin receiving aperture and a mechanism having a rod inserted into said pin receiving aperture for pushing up a connecting pin in said aperture, said receiving plate being disposed below said pipe fixing plate.

* * * * *